United States Patent [19]

Eriksson

[11] Patent Number: 5,883,542
[45] Date of Patent: Mar. 16, 1999

[54] ARRANGEMENT FOR REDUCING AND STABILIZING THE AMPLIFICATION OF A DARLINGTON-COUPLED OUTPUT STAGE

[75] Inventor: Hans Eriksson, Järfälla, Sweden

[73] Assignee: Telefonaktiebolaget LM Ericsson, Stockholm, Sweden

[21] Appl. No.: 961,027

[22] Filed: Oct. 30, 1997

[30] Foreign Application Priority Data

Nov. 8, 1996 [SE] Sweden .................................. 9604104

[51] Int. Cl.$^6$ ................................................ H03K 17/615
[52] U.S. Cl. .......................... 327/483; 327/575; 327/108; 330/290; 330/292
[58] Field of Search ................................. 327/483, 575, 327/108, 432; 330/290, 292

[56] References Cited

U.S. PATENT DOCUMENTS

| | | | |
|---|---|---|---|
| 4,374,364 | 2/1983 | Hemery et al. .......................... | 330/298 |
| 4,616,144 | 10/1986 | Hideshima et al. ..................... | 327/575 |
| 4,755,694 | 7/1988 | Bodig et al. ............................. | 327/575 |
| 4,956,565 | 9/1990 | Bahlmann ................................ | 327/108 |
| 5,307,027 | 4/1994 | Grasset .................................... | 330/288 |
| 5,428,316 | 6/1995 | Molnar .................................... | 330/253 |
| 5,548,248 | 8/1996 | Wang ....................................... | 330/290 |

FOREIGN PATENT DOCUMENTS 2 214 377  8/1989  United Kingdom ............ H03F 3/347

*Primary Examiner*—Timothy P. Callahan
*Assistant Examiner*—Terry L. Englund
*Attorney, Agent, or Firm*—Burns, Doane, Swecker & Mathis, L.L.P.

[57] ABSTRACT

In order to stabilize the idle current and the bandwidth of a Darlington-coupled output stage, the output stage is adapted, within an interval of currents, to continuously increase its current amplification with increasing input current from a first amplification value to a second amplification value.

1 Claim, 1 Drawing Sheet

FIGURE
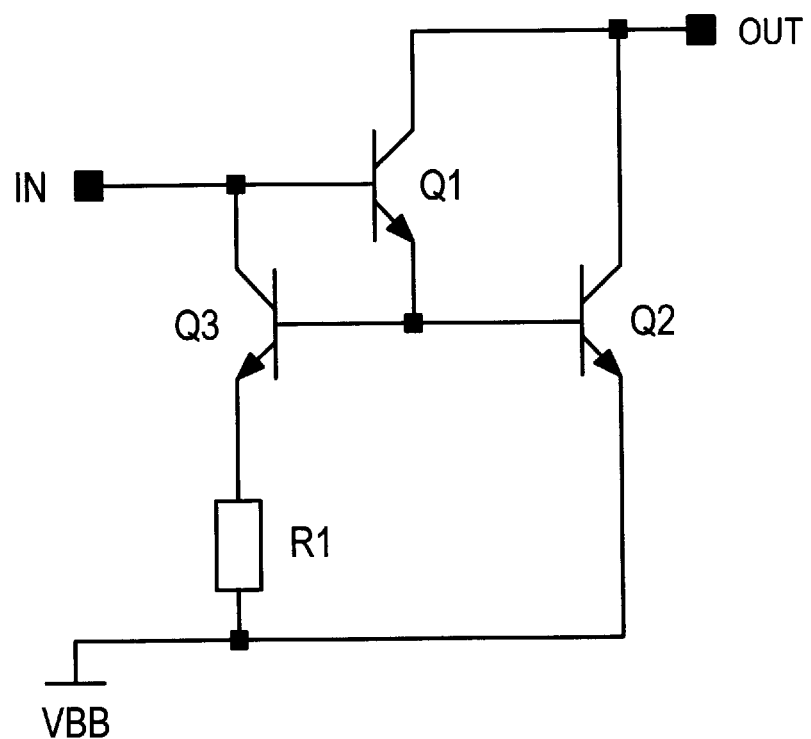

ARRANGEMENT FOR REDUCING AND STABILIZING THE AMPLIFICATION OF A DARLINGTON-COUPLED OUTPUT STAGE

TECHNICAL FIELD

The invention relates to an output stage and, more specifically, to an arrangement for stabilizing the idle current and the bandwidth of a known Darlington-coupled output stage comprsing bipolar transistors

BACKGROUND

Such a known output stage has a high current amplification also for low currents. This causes the bandwidth of the output stage to be reduced when the current is reduced. The current amplification varies from transistor to transistor and, moreover, the current amplification is temperature dependent. This causes problems with the stabilization of the idle current of the output stage.

SUMMARY

The object of the invention is to eliminate these problems in known output stages.

This is attained according to the invention in that the current amplification of the output stage is caused to increase and decrease with increasing and decreasing input current, respectively, to the output stage.

Hereby, a high current amplification is obtained at a high input current which results in low driving currents and low internal power consumption in the driving stages. At a low input current the current amplification of the output stage is reduced to substantially match the cut-off frequency of the transistors, which is reduced in a manner known per se, so that the bandwidth of the output stage will be substantially stable. A low and stable amplification at low input currents also simplifies the control of the idle current of the output stage quite considerably.

BRIEF DESCRIPTION OF THE DRAWING

The invention will be described more in detail below with reference to the appended drawing, on which the single figure shows an embodiment of an output stage according to the invention.

DETAILED DESCRIPTION

The figure shows an output stage according to the invention, having an input terminal IN, an output terminal OUT, and a supply voltage terminal VBB.

In a manner known per se, the output stage shown comprises a transistor Q1 whose base is connected to the input terminal IN and whose collector, in the embodiment shown, is connected to the output terminal OUT. The collector of the transistor Q1 can be connected to another supply voltage terminal or ground. The emitter of the transistor Q1 is connected to the base of a transistor Q2. The collector of the transistor Q2 is connected to the output terminal OUT, while its emitter is connected to the supply voltage terminal VBB.

In a manner known per se, the transistor Q2 is selected to have a certain, given emitter area in view of the expected, maximum collector current in the application in question.

The portion of the output stage according to the invention, described so far, is usually called a Darlington-circuit, is known per se and exhibits the disadvantages mentioned above in the introductory portion.

The amplification of the known output stage will be equal to the product of the amplification $\beta1$ of the transistor Q1 and the amplification $\beta2$ of the transistor Q2.

According to the invention, a transistor Q3 is connected with its collector to the input terminal IN, with its emitter to the supply voltage terminal VBB via a resistor R1, and with its base to the interconnection point between the emitter of the transistor Q1 and the base of the transistor Q2.

According to the invention, the emitter area of the transistor Q3 is chosen in such a manner that the ratio between the emitter areas of the transistors Q2 and Q3 is much smaller than $\beta1$ times $\beta2$.

The embodiment of the output stage according to the invention, illustrated on the drawing, is intended to amplify an input current on the input terminal IN and output on the output terminal OUT, an amplified version of the input current. The input current on the teal IN is divided into a base current to the transistor Q1 and a collector current to the transistor Q3. Thus, the emitter current of the transistor Q1 becomes the base current to the transistors Q2 and Q3.

For low input currents, the voltage drop will be small across the resistor R1 which causes the base-emitter voltages of the transistors Q2 and Q3 to become substantially equal. Hereby, the ratio between the collector voltages of the transistors Q2 and Q3 will be substantially equal to the ratio between the emitter areas of the transistors Q2 and Q3, since the emitter area is a measure of the size of a transistor. Thus, also the amplification of the output stage, which is substantially equal to the ratio between the collector currents of the transistors Q2 and Q3, becomes equal to the ratio between the emitter areas of the transistors Q2 and Q3. Thus, a desired idle current in the transistor Q2 is obtained simply by inputting a suitable input current to the input terminal IN, For higher input currents on the terminal IN, the voltage drop across the resistor R1 increases, which causes the base-emitter voltage of the transistor Q3 to decrease relative to the base-emitter voltage of the transistor Q2. Thus, the collector current of the transistor Q2 increases faster than the collector current of the transistor Q3. Hereby, the amplification will increase with increasing input current since the amplification as mentioned above is equal to the ratio between the collector currents of the transistors Q2 and Q3.

For high input currents, the voltage drop across the resistor R1 will be so large that the input current to the terminal IN substantially does not any longer give an increasing collector current in the transistor Q3. Each increase of the input current above this, thus, substantially goes as base current to the transistor Q1. The emitter current of the transistor Q1 is equal to the amplificafion $\beta1$ times the input current This emitter current goes substantially as base current to the transistor Q2. Its collector current is equal to the amplification $\beta2$ times its base current and consequently, the collector current of the transistor Q2 becomes equal to $\beta1$ times $\beta2$ times the input current. Thus, also in this case, the amplification of the output stage goes towards $\beta1$ times $\beta2$ for high input currents.

The advantage of the output stage according to the invention is that the amplification is input current dependent and can be made arbitrarily low and stable by being essentially dependent on said ratio between the emitter areas for low input currents. Thereby, a desired bandwidth can be maintained in the output stage down to much lower currents than what has been possible so far.

That the amplification is input current dependent and can be made arbitrarily low for low input currents also simplifies the problem of stabilizing the idle current.

What is claimed is:

1. An arrangement for reducing and stabilizing amplification of a Darlington-coupled output stage for low input currents, the output stage including a first transistor having its base connected to an input terminal of the output stage and its emitter connected to the base of a second transistor whose emitter is connected to a supply voltage terminal of the output stage and whose collector is connected to an output terminal of the output stage, the arrangement comprising:

a third transistor having its collector connected to the input terminal, its emitter connected to the supply voltage terminal via a resistor, and its base connected to an interconnection point between the emitter of the first transistor and the base of the second transistor, wherein a ratio between emitter areas of the second and the third transistors is smaller than an amplification of the first transistor times an amplification of the second transistor, whereby the amplification of the output stage for low input currents corresponds to the ratio between the emitter areas.

* * * * *